United States Patent
Ellsaesser (10) Patent No.: US 10,264,679 B2
(45) Date of Patent: Apr. 16, 2019

(54) SPECIAL ELECTRIC COMPONENT, PRINTED CIRCUIT BOARD ASSEMBLY, AND METHOD OF MANUFACTURING AN ELECTRIC APPLIANCE

(71) Applicant: Braun GmbH, Kronberg (DE)

(72) Inventor: Christian Ellsaesser, Kelkheim (DE)

(73) Assignee: The Procter & Gamble Company, Cincinnati, OH (US)

( * ) Notice: Subject to any disclaimer, the term of this patent is extended or adjusted under 35 U.S.C. 154(b) by 256 days.

(21) Appl. No.: 15/097,018

(22) Filed: Apr. 12, 2016

(65) Prior Publication Data

US 2016/0316564 A1 Oct. 27, 2016

(30) Foreign Application Priority Data

Apr. 21, 2015 (EP) .................................... 15164470

(51) Int. Cl.
| | | |
|---|---|---|
| *H05K 1/11* | (2006.01) | |
| *H05K 1/18* | (2006.01) | |
| *H05K 3/34* | (2006.01) | |

(52) U.S. Cl.
CPC ............. *H05K 1/184* (2013.01); *H05K 1/115* (2013.01); *H05K 3/3447* (2013.01); *H05K 2201/0338* (2013.01); *H05K 2201/1009* (2013.01); *H05K 2201/10037* (2013.01); *H05K 2201/10757* (2013.01); *H05K 2201/10787* (2013.01); *H05K 2201/10818* (2013.01); *H05K 2201/10871* (2013.01); *H05K 2203/046* (2013.01)

(58) Field of Classification Search
CPC ....... H05K 1/184; H05K 1/115; H05K 3/3447
See application file for complete search history.

(56) References Cited

U.S. PATENT DOCUMENTS

| | | | | |
|---|---|---|---|---|
| 4,241,497 A | * | 12/1980 | Du Bois | ............ H05K 13/0473 29/839 |
| 4,541,034 A | * | 9/1985 | Fanning | ................. H05K 3/308 174/255 |
| 4,625,399 A | * | 12/1986 | Zemek | ............... H05K 13/0439 227/90 |
| 4,951,124 A | | 8/1990 | Sawaya | |
| 5,096,425 A | * | 3/1992 | Takahashi | ................ H01C 1/14 257/E23.044 |

(Continued)

FOREIGN PATENT DOCUMENTS

EP 2690936 A1 1/2014

OTHER PUBLICATIONS

CM4235FQ Extended EP Search Report for EP 15164470.5 dated Jan. 4, 2016.

*Primary Examiner* — Nathan Milakovich
(74) *Attorney, Agent, or Firm* — Parker D. McCrary; Vladimir Vitenberg (57) ABSTRACT

A special electric component, such as a motor, an accumulator, or an electric subassembly, having at least one soldering pin for solder-joining the special electric component to a printed circuit board. The soldering pin has a connection end that comprises a front section at a free end of the soldering pin and a first section adjacent the front section. The front section has a width that is smaller than the width of the first section. A printed circuit board assembly and an electric device comprising at least one special electric component.

15 Claims, 4 Drawing Sheets

(56) References Cited

U.S. PATENT DOCUMENTS

| | | | | |
|---|---|---|---|---|
| 5,166,570 A * | 11/1992 | Takahashi | ............... | H01G 2/06 |
| | | | | 174/528 |
| 5,398,165 A | 3/1995 | Niinou | | |
| 5,654,878 A * | 8/1997 | Sasao | ................... | H01R 43/205 |
| | | | | 257/692 |
| 5,726,862 A * | 3/1998 | Huynh | .................... | H01L 33/62 |
| | | | | 361/773 |
| 6,049,039 A * | 4/2000 | Fushimi | ................ | H01R 4/028 |
| | | | | 174/267 |
| 6,896,526 B2 * | 5/2005 | Pitzele | ................ | H05K 3/3447 |
| | | | | 174/266 |
| 7,018,243 B2 | 3/2006 | Guglhoer | | |
| 7,361,983 B2 * | 4/2008 | Hayashi | ............ | H01L 23/49541 |
| | | | | 257/666 |
| 7,563,112 B2 * | 7/2009 | Honda | ............... | H01R 43/0256 |
| | | | | 439/79 |
| 9,119,327 B2 * | 8/2015 | Albrecht, III | ........ | H05K 1/0203 |
| 2006/0192273 A1 | 8/2006 | Lange et al. | | |
| 2009/0246615 A1 * | 10/2009 | Park | ................... | H01M 2/0404 |
| | | | | 429/149 |
| 2010/0093197 A1 | 4/2010 | Sander | | |
| 2012/0268854 A1 | 10/2012 | Schmidtlein | | |
| 2016/0317268 A1 | 11/2016 | Dietzel et al. | | |
| 2016/0331119 A1 | 11/2016 | Schaefer et al. | | |
| 2016/0331120 A1 | 11/2016 | Scheele et al. | | |
| 2017/0001352 A1 | 1/2017 | Kunz | | |
| 2017/0004703 A1 | 1/2017 | Schiebahn et al. | | |
| 2017/0031000 A1 | 2/2017 | Engelmohr et al. | | |
| 2017/0105823 A1 | 4/2017 | Lueckel et al. | | |

\* cited by examiner

SPECIAL ELECTRIC COMPONENT, PRINTED CIRCUIT BOARD ASSEMBLY, AND METHOD OF MANUFACTURING AN ELECTRIC APPLIANCE

FIELD OF THE INVENTION

The present invention is concerned with a special electric component having a soldering pin and it is concerned with a printed circuit board assembly comprising such a special electric component connected to a printed circuit board. The invention is further concerned with an electric appliance and a method of manufacturing an electric appliance.

BACKGROUND OF THE INVENTION

It is known that special electric components (also known as odd-form components) that are not suitable for direct surface mounting or mounting via automated through-hole technology to a printed circuit using a standard pick-and-place machine (e.g. a SIPLACE machine from ASM Assembly Systems GmbH & Co. KG) have soldering pins for connecting the special electronic component to the printed circuit board. Such special electric components may be e.g. a battery or an accumulator, a small DC motor, or an electric sub-assembly. Such special electric components may be connected to a printed circuit board by providing a soldering pin that is bend around the circuit board and that is connected to a metallized portion (so-called solder land) of the printed circuit board by applying heated liquid solder. Such a known method leads to a relatively large height of the soldering connection (when compared with the height of typical SMT mounted components) and in particular the height of the soldering connection cannot be precisely controlled leading to high tolerances. This limits possible designs of electric appliances in which such a printed circuit board assembly is used as the headroom between the printed circuit board assembly and e.g. a housing of the electric appliance needs to accommodate the height of the soldering connection and of the tolerances of this height. Sometimes even a reduction of the necessary headroom by a small distance may render new designs possible, e.g. a particularly slim housing of a handle of an electric toothbrush.

It is thus an object of the present disclosure to provide a special electric component, a printed circuit board assembly, an electric appliance, and a method of manufacturing an electric appliance that lead to soldering connections having a lower tolerance of the height of the soldering connection between special electronic component and printed circuit board than typically possible by the known technologies.

SUMMARY OF THE INVENTION

In accordance with one aspect there is provided a special electric component such as a motor, an accumulator, or an electric subassembly having at least one soldering pin, in particular at least two soldering pins, for solder joining the special electric component to a printed circuit board, wherein the at least one soldering pin has a connection end that comprises a front section at the free end of the soldering pin and a first section adjacent the front section, where the front section has a width that is smaller than the width of the first section, in particular wherein the width of the front section is at least 25% smaller than the width of the first section, in particular at least 50% smaller.

In accordance with one aspect there is provided a printed circuit board assembly having a special electric component as proposed in the present disclosure and a printed circuit board, wherein the printed circuit board has a metallized through-hole through which the front section of the soldering pin extends and wherein the soldering pin is connected to the printed circuit board by a solder joint.

BRIEF DESCRIPTION OF THE DRAWINGS

The present disclosure will be further elucidated by a detailed description of example embodiments with reference to figures. In the figures

DETAILED DESCRIPTION OF THE INVENTION

A "special electric component" (also known as an odd-form component) in accordance with the present disclosure is an electronic component that is neither SMT mountable nor placeable onto a printed circuit board (PCB) by a standard pick-and-place machine (e.g. a SIPLACE machine from ASM Assembly Systems GmbH & Co. KG) in particular as the special electric component is to heavy and/or to voluminous and/or to oddly formed to be provided on a tray or a tape etc. Examples for such special electric components are AC or DC motors suitable for hand-held electric devices, batteries or accumulators for use with hand-held electric devices, charging coil assemblies for use with hand-held electric devices, or electric sub-assemblies for hand-held electric devices such as a half-finished product (e.g. a pre-assembled electric toothbrush chassis for placement into a handle of the electric toothbrush). An electric sub-assembly may include one or several of the mentioned other special electric components. In accordance with the present disclosure, a special electric component has at least one soldering pin (in particular, the special electric component has two, three, four, five, six or even more soldering pins) for connecting the special electric component with a PCB. A hand-held electric device may be an electric grooming device such as an electric shaver or an electric epilator, an electric personal hygiene device such as an electric toothbrush or an electric flosser, an electric tool, an electric kitchen device etc.

A "printed circuit board assembly" as used herein is a printed circuit board solder connected with one or several special electric components.

A special electric component as proposed in the present disclosure has at least one soldering pin (and may have in particular at least two soldering pins, which may extend parallel to each other), where the free end of the at least one soldering pin has a connection end that has a front section and an adjacent first section arranged behind the front section (i.e. distal to the free end), where the first section is wider than the front section. The first section may be at least 33% wider than the front section, in particular it may be at least twice as wide as the front section. The connection end is in particular t-shaped, where at least one wing section laterally projects from the soldering pin. A lateral edge of the front section and a transverse edge of the wing section may be arranged at an angle larger than 90 degrees, in particular at an angle of at least 92.5 degrees and optionally at an angle of between about 95 degrees and 105 degrees. The lateral edge of the front section is in particular parallel to a longitudinal extension direction of the soldering pin, so that the wing section is then arranged like a "hanging shoulder". As will be explained in more detail further below, the "hanging shoulder" wing section on the one hand provides a large area for accommodating excess solder material and on the other hand guides liquid solder away from a printed circuit board. This may in particular be supported by a solderable surface coating (e.g. a metallization comprising e.g. at least one of nickel, silver, gold, or tin) of at least the main surfaces of the connection end (i.e. the main surfaces of the front section and of the first section) that does not extend to the narrow sides of the connection end.

In some embodiments, the special electric component has at least two soldering pins, which extend parallel to each other. Ideally, the free ends of the soldering pins end in a plane that extends perpendicular to a longitudinal extension direction of the soldering pins. Due to the size of the special electric component, the free ends of the soldering pins may be positioned at a distance of 10 mm or more, which is an unusual distance for soldering pins. Due to manufacturing tolerances, the free ends may lie at different heights with respect to the longitudinal extension direction. Thus, in assembling a printed circuit board assembly by first providing the special electric component and then by pushing a printed circuit board having at least two through holes provided at a distance coinciding with the distance of the free ends of the soldering pins over the free ends of the soldering pins, one first section (e.g. a transverse edge of a wing section) of one of the soldering pins may already abut against a backside of the printed circuit board, while the first section of the other soldering pin is still at a certain distance to the backside of the printed circuit board. In order to achieve that both first sections of the two soldering pins abut at the backside of the printed circuit board (to assure that both front sections extend through the through holes with an intended length), at least one of the soldering pins has a resilient section, which is in particular realized as a spring-like deformation of the soldering pin. In particular, the at least two soldering pins may each have such a resilient section. Then the printed circuit board can be pushed over the free ends of the two soldering pins until both first sections abut against the backside of the printed circuit board. This allows for a controlled and thus reliable connection with both soldering pins. In some embodiments, at least two special electric components are to be connected with one printed circuit board, and each of the special electric components has at least one soldering pin that has a resilient section. In some embodiments, at least two special electric components form an electric sub-assembly that is assembled prior to connecting the printed circuit board with the electric sub-assembly (e.g. the two special electric components are mounted each onto a connecting frame). This electric sub-assembly then forms a special electric component in accordance with the present disclosure.

Because of the resilient section, tolerances in the manufacturing can be balanced by the resilient section and not by a high length of the front section which would lead to an uncontrolled height of the front section poking through the PCB and thus to an uncontrolled height of the solder connection. The front section can thus be made as short as needed so that a reliable solder connection with the printed circuit board is achieved, but where the height of the solder connection on a front side of the printed circuit board (on which side the front section will protrude) is low and controllable.

Figures 1A, 1B:
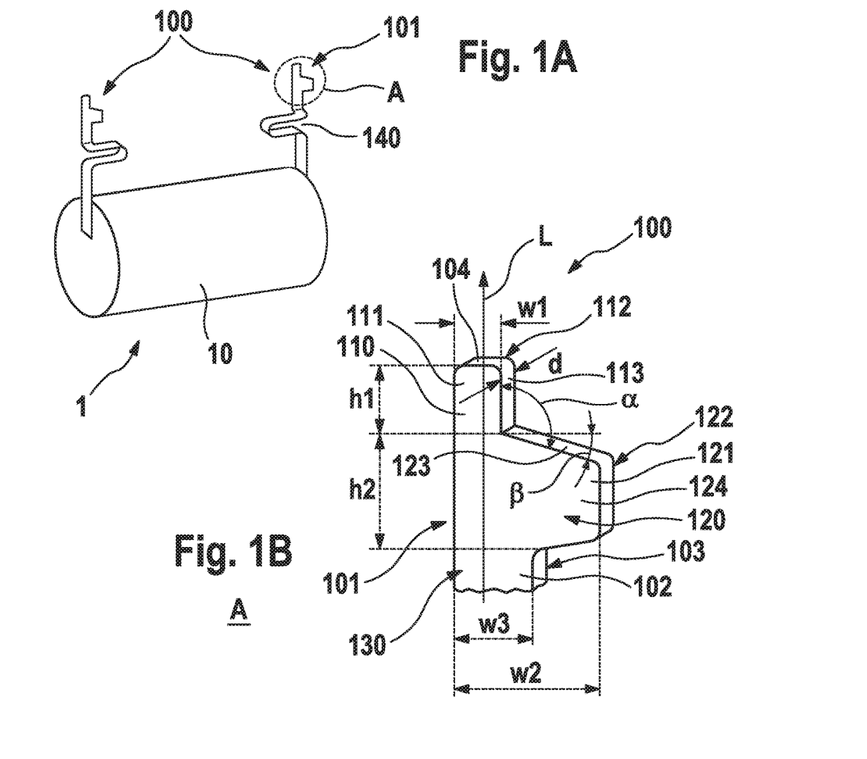
FIG. 1A is a schematic depiction of a special electric component having two soldering pins.
FIG. 1B is a magnification of a connection portion of a soldering pin indicated by portion A in FIG. 1A.

FIG. 1A is a schematic depiction of an example special electric component 1 in accordance with the present disclosure. The special electric component 1 has a body 10 and has at least one soldering pin 100, where in FIG. 1A two soldering pins 100 are shown. The body 10 of the special electric component may be a DC motor suitable for handheld electronic appliances such as electric toothbrushes or epilators or electric shavers, an energy-storage such as a secondary battery, a charging coil assembly, or an electric sub-assembly. The soldering pins 100 are intended for connection with a printed circuit board (PCB). In some embodiments, at least one soldering pin 100 has a resilient section 140 (e.g. realized by a spring-like deformation of the soldering pin) for in particular accommodating tolerances of the assembly process as has generally been described in a previous paragraph. A detailed discussion of a connection end 101 arranged at the free end of the soldering pin 100 will be given below with reference to FIG. 1B, which shows a magnification of a front region A (indicated by dashed lines) of the example soldering pin 100, which front region includes the connection end 101. The soldering pin may in particular be made from conductive sheet metal having a solderable surface coating as will be explained further below.

FIG. 1B is a magnification of the connection end 101 of the example soldering pin 100 indicated by dashed ring A in FIG. 1A. The soldering pin 100 has a first main surface 102 and a second main surface 103 opposite the first main surface 102 and a narrow side 104. In some embodiments, the narrow side 104 has received a surface treatment so that solder does not connect with the narrow side 104. In addition or alternatively, at least one of the main surfaces 102 or 103 may have received a surface treatment (e.g. metallization) for improved connectivity with the solder material.

The connection end 101 of the soldering pin 100 comprises a front section 110 and a first section 120, which are successively arranged with respect to a length extension direction L of the connection end 101 of the soldering pin 100. The front section 110 has a width w1 and a height h1 (where the height h1 is measured along the length extension direction L and the width w1 is measured in a direction perpendicular to the length extension direction). The connection end 101 may be made from conductive sheet metal of thickness d. The front section 110 has two opposite main surfaces 111 and 112. In length extension direction L arranged adjacent to the front section 110 is the first section 120, which has a width w2 that is larger than the width w1 of the front section 110 (e.g. larger by at least 33%, in particular by at least 100%). The first section 120 has here a wing section 124 that laterally projects away from the front section 110. In other embodiments, the first section has two opposite wing sections that project away on both sides of the soldering pin. The two wing sections may be of different shape or may have identical, but mirrored shape. A lateral edge 113 of the front section 110 (which lateral edge is essentially parallel to the length extension direction L) and a transverse edge 123 of the wing section 120 are arranged at an angle α, which angle α may in particular be larger than 90 degrees, so that the transverse edge 123 of the wing section 124 is "hanging" with respect to the length extension direction L. This shall mean that the transverse edge 123 of the wing section 124 is arranged at an angle β with a plane perpendicular to the length extension direction L. As will be explained in connection with FIG. 2, this "hanging shoulder" shape of the of the wing section 124 supports that, despite the relative large size of the soldering pin 100 of the special electric component 1 in comparison to e.g. soldering pins of a dual in-line package of an IC component, conductive tracks can still be arranged on a PCB in close proximity of a through hole for solder connection of the special electric component. The angle α may in particular be larger than 92.5 degrees and further in particular may be in between 95 degrees and 105 degrees (i.e. angle β may be at least 2.5 degrees and may in particular be in between 5 degrees and 10 degrees).

The particular t-shape of the connection end 101 of the soldering pin 100 supports that the front section will only extend through a through hole of a PCB by a predetermined length, as the transverse edge 123 works like an abutting edge. A larger angle α (or β) would tend to diminish the function of the wing section as stopper for achieving a defined length extension of the front section through the PCB. On the other hand, a smaller angle would potentially not allow arranging conductive tracks on the backside of the PCB in close proximity of the through hole as will be explained in more detail below.

Optionally, the connection end 101 of the soldering pin 100 may comprise a second section 130 arranged behind the first section with respect to the length extension direction L, which second section 130 may have a width w3 that is different to the width w2 of the first section 110, in particular where the width w3 of the second section is smaller than the width w2 of the first section 120. Due to the narrowing of the width of the second section 130 in comparison with the width of the first section 120 it can be achieved that heat introduced via the front section 110 during the soldering process also heats the first section 120 so that liquid solder can attach to a substantial portion of the area of the first section 120 before it solidifies.

The thickness d of the sheet material from which the connection end 101 of the soldering pin 100 may be made may be in the range of between 0.1 mm and 0.4 mm, in particular in the range of between 0.15 mm to 0.35 mm. The height h1 of the front section depends on the thickness of the PCB and on the intended projection height above a front side of a printed circuit board (see FIG. 2), e.g. a projection height of between 0.3 mm and 1.2 mm, so that h1 may be in the range of between 1.0 mm and 5.0 mm. The width w1 of the front section may be in the range of between 0.5 mm to 1.7 mm. The height h2 of the first section may be in the range of between 1.0 mm and 2.0 mm. The width w2 of the first section may be in the range of between 1.0 mm to 3.0 mm.

The soldering pin 100 may be made from electro nickel plated rolled band, e.g. H2D DC04 LC from company Hille & Müller GmbH, Düsseldorf, Germany.

Possible materials for a soldering pin comprising a resilient section are, e.g., stainless steel sheet such as X10CrNi18-8, general sheet steel, sheet brass, sheet bronze, sheet copper or any other metal sheet that can be formed by a punch and bending machine. The main surfaces of the connection end of the soldering pin may in particular have a solderable surface metallization (e.g. a metallization made from Ni/Sn, Ni/Au, Ni/Ag or Ni/AgPd), which surface metallization does then not extend to the narrow side of the connection end.

As mentioned before, the special electric component 1 is in particular not suitable for surface-mounting technology (SMT) and also not for standard through-hole technology (THT) or pin-in-hole technology (PIH). From a manufacturing point of view, the special electric component 1 may be first assembled together with other parts and then a printed circuit board (PCB) is connected with the soldering pin(s) 100. At least in one prior art embodiment, a front portion of a soldering pin was bent and then soldered to the front side of the PCB, which—as had been mentioned before—is not an easily controllable automated process. The resulting soldering connections on the one hand had a height larger than the typical surface mounted components. On the other hand, the height of the soldering connection had a relatively high tolerance, which particular in edge regions required to foresee certain headroom between the PCB and an appliance housing that limited the design possibilities.

Figure 2:
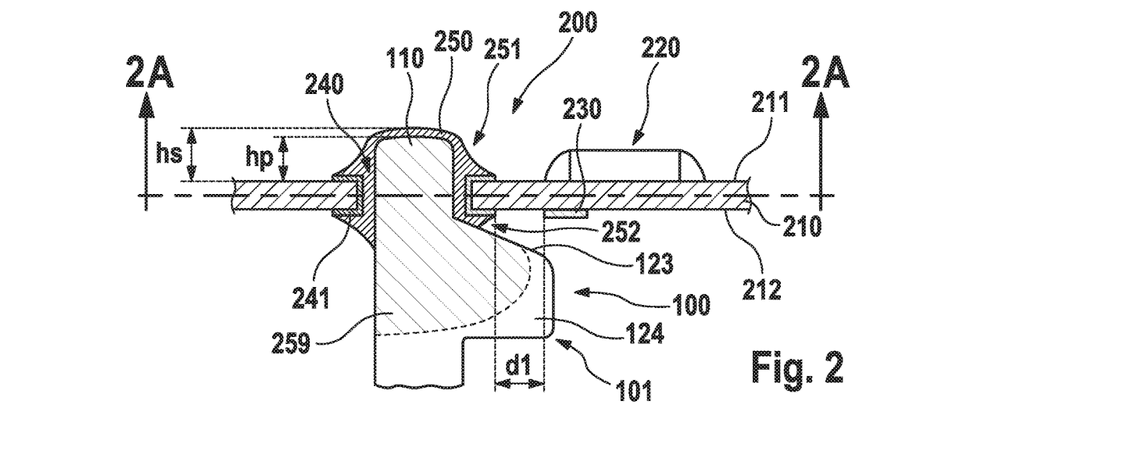
FIG. 2 is a portion of a cross sectional cut through a printed circuit board assembly showing a solder joint between a connection portion of a soldering pin and a printed circuit board and further elements of the printed circuit board.

FIG. 2 is a cross-sectional cut through a portion of a printed circuit board assembly 200 comprising a printed circuit board 210 on which surface-mounted devices (SMDs) 220 may be mounted and further the printed circuit board assembly 200 comprises a special electric component as discussed with respect to FIG. 1A. The special electric component comprises a soldering pin 100 with a connection end 101 as has been discussed in connection with FIG. 1B. The same reference numerals are used for the same parts of the connection end 101 as in FIG. 1B. Only the connection end 101 of the soldering pin 100 is shown in FIG. 2, where the front section 110 of the connection end 101 was pushed from a backside 212 of the printed circuit board 200 through a through-hole 240 to a front side 211 of the printed circuit board 210, so that in the shown embodiment, a transverse edge 123 of a wing section 124 of the first section abuts the backside 212 of the printed circuit board 210. The soldering pin 100 may have a resilient section as explained before, which resilient section may have become compressed in the assembling process. The through-hole 240 has a surface metallization 241 that forms rings around the through hole 240 on the front side 211 and on the backside 212 of the printed circuit board 210 and also covers the inner walls of the through hole 240. The metallized rings may have a width of about 0.3 mm to about 1.5 mm. Liquid solder material had been applied in the assembling process so that a solder connection 250 was established. The solder connection 250 has a front side portion 251 and a backside portion 252. A shaded region 259 indicates the potential size of the backside portion 252 of the solder connection 250. Excess liquid solder had been conveyed away from the front side portion 251 by capillary forces between the front section 110 of the soldering pin 100 and the through hole 240. The relatively large area of the first section 120 serves to accommodate a large portion of solder material, which does thus not pile up on the front side 211 of the printed circuit board 210 and thus allows realizing a flat front side portion 251 of the solder connection 250. A projecting height $h_p$ of the front section 110 of the soldering pin 100 may be within about 0.3 mm to about 1.2 mm. The lower range value serves to provide enough length of the front section extending beyond the front side of the PCB to allow reliable connection of the soldering pin with the PCB. The upper range value was here chosen to coincide with typical heights of components provided on the front side of the PCB (i.e. surface mounted components 220). Other values may be chosen for the upper range value depending on the needs of the design, e.g. 1.0 mm, 1.5 mm, or 2.0 mm. Due to the described structure of the soldering pin 100, the projecting height $h_p$ can be controllably achieved. The height $h_s$ of the solder connection is about the same as the projecting height $h_p$ of the front section 110 as excess solder is conveyed away from front side 211 towards the backside 212 of the printed circuit board 210. Due to the hanging shoulder shape of the first section 120 and also as the small side 123 of the wing section 124 has not received a surface metallization, the backside portion 252 of the solder connection 250 forms a retracted solder portion between the backside metallization ring of the through-hole 240 and the wing section 124. This allows that a conductive track 230 can be arranged in close proximity of the through-hole 240 despite the relatively large size of the connection end 101 of the soldering pin 100. A distance dl between an edge of the conductive track 230 and an edge of the metallization ring of the through hole 240 may be as small as 0.3 mm.

Figure 2A:
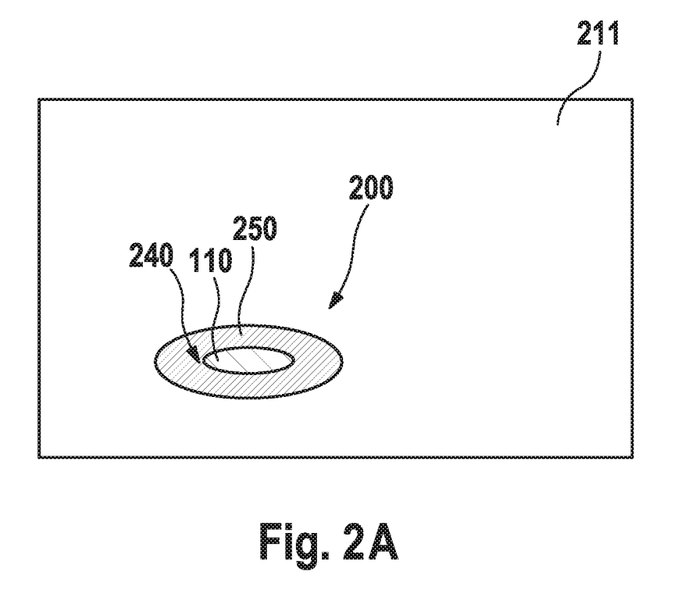
FIG. 2A is a top view of a cross section along line 2A of FIG. 2.

In order to achieve the capillary forces, the size of the through-hole 240 may be chosen so that the distances between a centrally positioned front section 110 of a soldering pin 100 and the inner wall of the through-hole 240 is about or less than 0.5 mm, e.g. for a front section having a width w1 of 1 mm, a circular through-hole with a diameter of 1 mm may be chosen or an elongated through-hole having a small axis of 1 mm and a long axis of 2 mm may be chosen, as in FIG. 2A.

Figure 3:
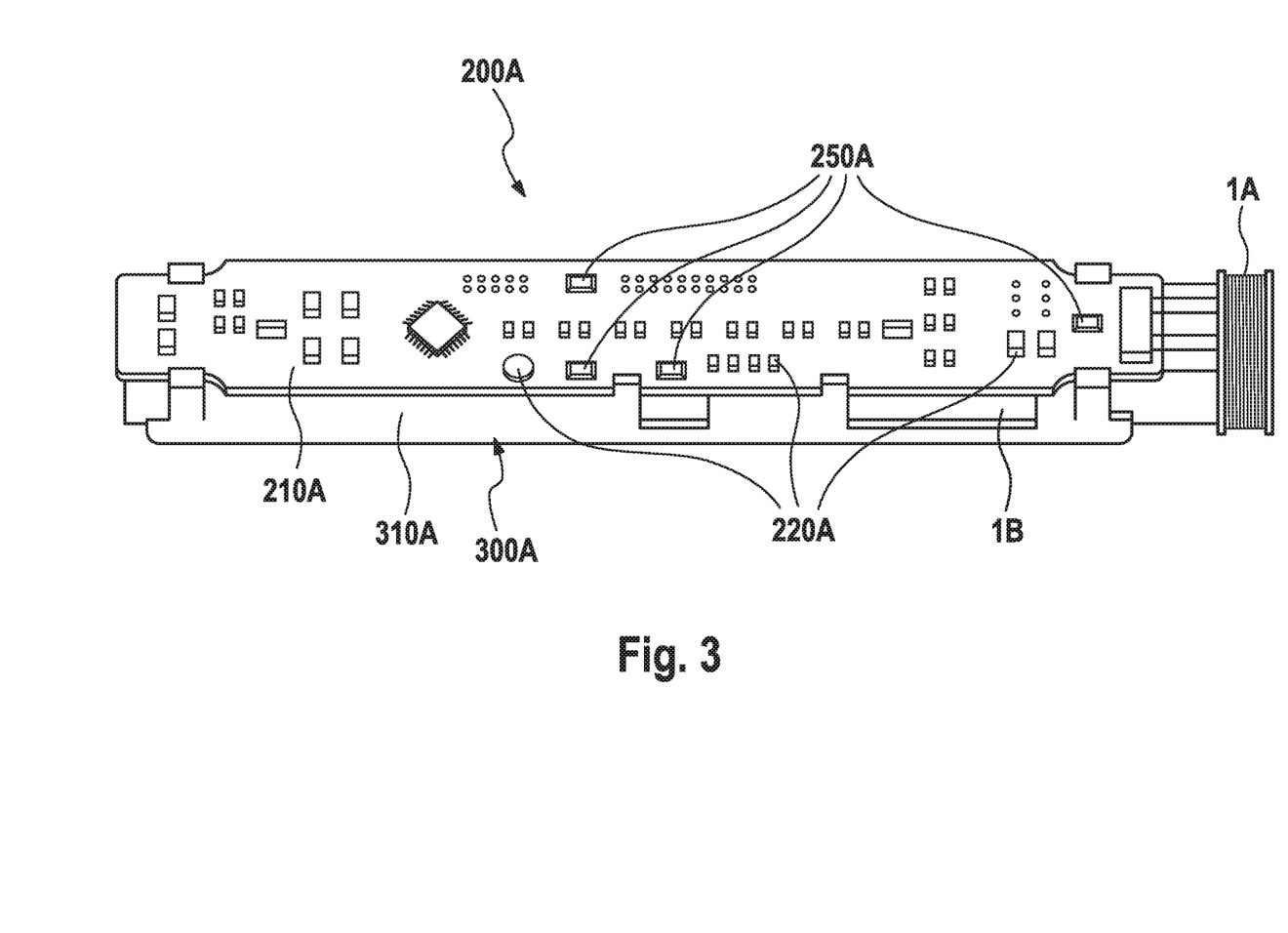
FIG. 3 shows a view onto an example embodiment of a printed circuit board assembly.

FIG. 3 is a depiction of a printed circuit board assembly 200A comprising a printed circuit board 210A and a special electric component 300A that is here an electric sub-assembly. The electric sub-assembly 300A comprises a chassis 310A and several special electric components 1A, 1B, where a first special electric component 1A is a charging coil and a second special electric component 1B is a rechargeable accumulator. The special electric components 1A, 1B may be connected with the chassis 310A so that the soldering pins of the special electric components are projecting parallel to each other at defined locations. Solder connections 250A are visible on the front side of the printed circuit board 210A, where soldering pins of the special electric component 300A are electrically connected with the printed circuit board 210A. Further odd-shaped components may be present as well, e.g. a DC motor or a proprietary component. Each of the special electric components 1A, 1B has at least one soldering pin in accordance with the present disclosure, and in particular each of the special electric components has at least two soldering pins in accordance with the present disclosure. The printed circuit board 210A may comprise one or several SMD components 220A.

Figure 4:
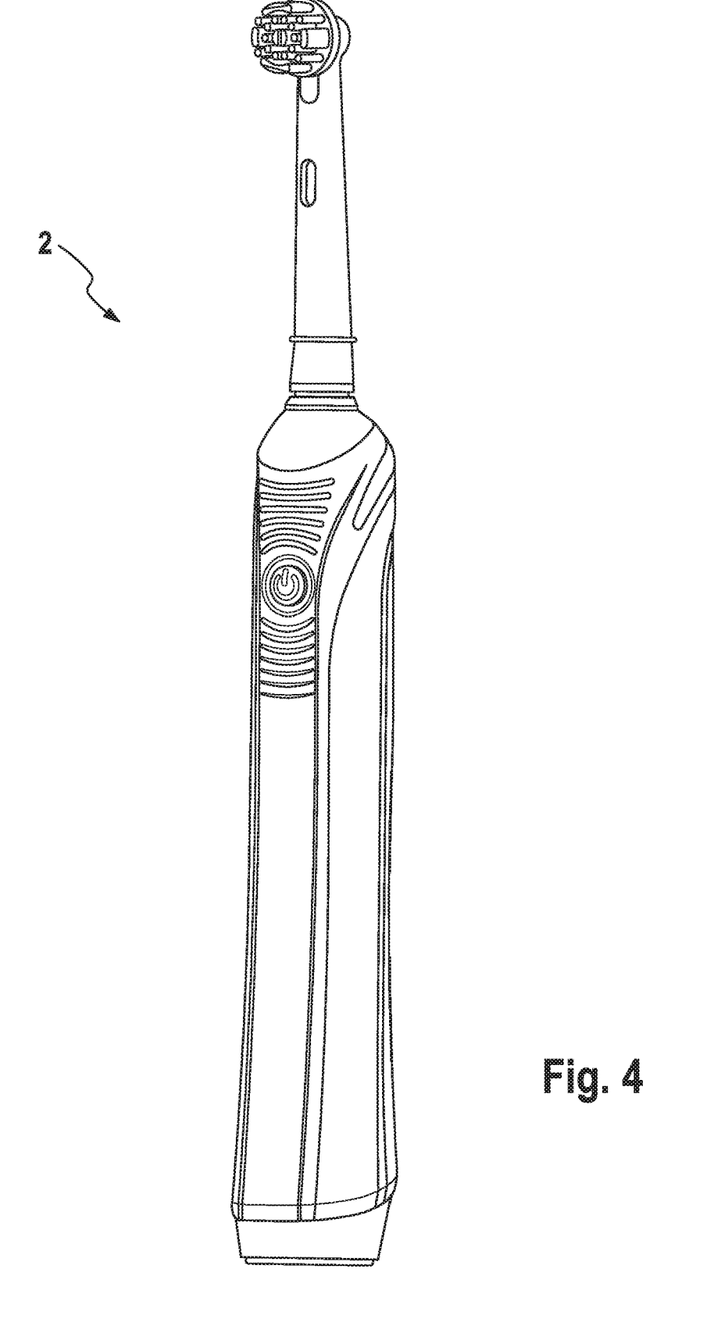
FIG. 4 is a depiction of an example electric appliance comprising a printed circuit board assembly as proposed herein.

FIG. 4 is a depiction of an example electric appliance 2 that comprises a printed circuit board assembly in accordance with the present disclosure. The electric appliance is here realized as an electric toothbrush, but it may be realized as any other electric appliance such a an electric shaver, an epilator, a hair dryer, a curling iron, a hair straightener, an electric kitchen device, an electric tool etc.

An electric appliance comprising a printed circuit board assembly as proposed herein is made by following the steps of:
  providing a special electric component as proposed in the present disclosure;
  providing a printed circuit board having at least one metallized through hole having a size chosen such that capillary forces occur between a soldering pin of the special electric component and the through-hole that are strong enough to convey away liquid excess solder from a front side of the printed circuit board to a backside (as mention before, the through-hole may be dimensioned in a manner that the distances between a centrally positioned front section of a soldering pin and the inner wall or walls of the through-hole are about or less than 0.5 mm);
  pushing the front section of the at least one soldering pin from the backside of the printed circuit board to the front side of the printed circuit board through the through hole until the front section pokes through the front side by at least about 0.3 mm and optionally by less than 1.2 mm; and
  connecting the soldering pin to the printed circuit board by applying liquid solder onto the front side of the printed circuit board at the location of the through hole.

The manufacturing method may include one or several of the following steps:
  in the connecting step conveying away excess solder through the through hole towards the first section of the soldering pin by capillary forces occurring between the through hole and front section of the soldering pin extending within the through hole;
  in the step of pushing the front section of the soldering pin through the through hole pushing the front section until a transverse edge of the first section contacts the backside of the printed circuit board;
  providing at least two special electric components at positions fixed relative to each other and providing the printed circuit board with at least two metallized through holes coinciding in their distance to the distance of the soldering pins.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A printed circuit board assembly comprising:
   (i) a special electric component selected from the group consisting of a motor, an accumulator, an electric subassembly, or any combination thereof, comprising:
   at least one soldering pin for solder-joining the special electric component to a printed circuit board, the at least one soldering pin comprising:
     (a) a first main surface, (b) a second main surface opposite to the first main surface,
(c) a narrow side between the first and second main surfaces,
(d) a connection end comprising:
(1) a front section at a free end of the at least one soldering pin and
(2) a first section adjacent to the front section, the first section comprising a wing section that laterally projects away from the front section so that a lateral edge of the front section and a transverse edge of the wing section are arranged at an included angle of more than 90 degrees, wherein the front section has a width that is at least 25% smaller than a width of the first section, and
(e) a resilient section structured and configured to provide spring-like deformation of the at least one soldering pin;
(ii) the printed circuit board comprising:
(a) a front side,
(b) a backside opposite to the front side, and
(c) a metallized through-hole through which the front section of the at least one soldering pin of the special electric component extends and the at least one soldering pin of the special electric component is connected to the printed circuit board by a solder joint,
wherein the front section of the at least one soldering pin of the special electric component extends above the front side of the printed circuit board from about 0.3 mm to about 1.2 mm, and
wherein the at least one soldering pin has a solderable surface coating on the first main surface and the second main surface, but not on the narrow side so that solder does not bond with the narrow side.

2. The printed circuit board assembly of claim 1, wherein the width of the front section of the at least one soldering pin of the special electric component is at least 50% smaller than the width of the first section.

3. The printed circuit board assembly of claim 1, wherein the at least one soldering pin of the special electric component has a second section arranged adjacent to the first section and opposite to the front section, the second section having a width that is smaller than the width of the first section, wherein the front section, the first section, and the second section are arranged along a length extension of the at least one soldering pin to form, in combination, essentially a t-shaped structure.

4. The printed circuit board assembly of claim 3, wherein the lateral edge is substantially parallel to the length extension.

5. The printed circuit board assembly of claim 4, wherein the included angle between the lateral edge of the front section and the transverse edge of the wing section is at least 92.5 degrees.

6. The printed circuit board assembly of claim 4, wherein the included angle between the lateral edge of the front section and the transverse edge of the wing section is between 95 degrees and 105 degrees.

7. The printed circuit board assembly of claim 1, wherein the at least one soldering pin is made from a sheet material having a thickness of between 0.1 mm and 0.4 mm, wherein the width of the front section is between 0.5 mm and 2.0 mm.

8. The printed circuit-board assembly in accordance with claim 1, wherein the metalized through-hole has an elongated cross-section having a long axis and a short axis perpendicular to the long axis, and wherein the long axis is between 50% to 250% larger than the short axis.

9. The printed circuit-board assembly in accordance with claim 8, wherein the short axis is between 0.8 mm and 1.2 mm and the long axis is between 1.2 mm and 2.5 mm.

10. The printed circuit-board assembly in accordance with claim 1, wherein the printed circuit board has a conductive track on the backside, wherein a distance between a first edge of the conductive track and a second edge of the metalized through-hole is less than 0.5 mm, wherein the first edge is immediately adjacent to the second edge.

11. An electric appliance comprising the printed circuit-board assembly in accordance with claim 1.

12. A method of manufacturing an electric appliance, the method comprising the steps of:
providing a special electric component selected from the group consisting of a motor, an accumulator, an electric subassembly, or any combination thereof, comprising:
at least one soldering pin for solder-joining the special electric component to a printed circuit board, the at least one soldering pin comprising:
(a) a first main surface,
(b) a second main surface opposite to the first main surface,
(c) a narrow side between the first and second main surfaces,
(d) a connection end comprising:
(1) a front section at a free end of the at least one soldering pin and
(2) a first section adjacent to the front section, the first section comprising a wing section that laterally projects away from the front section so that a lateral edge of the front section and a transverse edge of the wing section are arranged at an included angle of more than 90 degrees, wherein the front section has a width that is at least 25% smaller than a width of the first section, and
(e) a resilient section structured and configured to provide spring-like deformation of the at least one soldering pin,
wherein the at least one soldering pin has a solderable surface coating on the first main surface and the second main surface, but not on the narrow side so that solder does not bond with the narrow side;
providing the printed circuit board having a front side and a backside opposite to the front side, the printed circuit board having at least one metallized through-hole with an inner wall, wherein a distance between a centrally positioned front section of the at least one soldering pin and the inner wall of the metalized through-hole is about 0.5 mm or less
pushing the front section of the at least one soldering pin from the backside to the front side of the printed circuit board through the metalized through-hole until the front section pokes through the front side by from about 0.3 mm to about 1.2 mm; and
connecting the at least one soldering pin to the printed circuit board by applying liquid solder onto the front side of the printed circuit board at a location of the metalized through-hole.

13. The method in accordance with claim 12, wherein the step of connecting includes conveying away excess liquid solder through the metalized through-hole towards the first section of the at least one soldering pin by capillary forces occurring between the metalized through-hole and front section of the soldering pin extending within the metalized through-hole.

14. The method in accordance with claim 12, wherein the step of pushing the front section of the at least one soldering pin through the metalized through-hole includes pushing the front section until a transverse edge of the first section contacts the backside of the printed circuit board.

15. A special electric component selected from the group consisting of a motor, an accumulator, an electric subassembly, or any combination thereof, comprising
- at least one soldering pin for solder-joining the special electric component to a printed circuit board comprising
  - (a) a first main surface,
  - (b) a second main surface opposite to the first main surface, and
  - (c) a narrow side between the first and second main surfaces,
  - (d) a connection end comprising:
    - (1) a front section at a free end of the at least one soldering pin and
    - (2) a first section adjacent to the front section, the first section comprising a wing section that laterally projects away from the front section so that a lateral edge of the front section and a transverse edge of the wing section are arranged at an included angle of more than 90 degrees, wherein the front section has a width that is at least 25% smaller than a width of the first section, and
  - (e) a resilient section structured and configured to provide spring-like deformation of the at least one soldering pin,
- wherein the at least one soldering pin has a solderable surface coating on the first main surface and the second main surface, but not on the narrow side so that solder does not bond with the narrow side.

* * * * *